United States Patent
Bae et al.

(10) Patent No.: US 7,456,641 B2
(45) Date of Patent: Nov. 25, 2008

(54) PROBE CARD THAT CONTROLS A TEMPERATURE OF A PROBE NEEDLE, TEST APPARATUS HAVING THE PROBE CARD, AND TEST METHOD USING THE TEST APPARATUS

(75) Inventors: Young-Gil Bae, Suwon-si (KR); Soon-Jong Park, Gyeonggi-do (KR); In-Su Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 213 days.

(21) Appl. No.: 11/434,419

(22) Filed: May 15, 2006

(65) Prior Publication Data

US 2007/0018664 A1  Jan. 25, 2007

(30) Foreign Application Priority Data

Jul. 25, 2005  (KR) ...................... 10-2005-0067376

(51) Int. Cl.
*G01R 31/02* (2006.01)
(52) U.S. Cl. ...................... 324/754; 324/762
(58) Field of Classification Search ................ 324/754, 324/760–762; 136/203, 225
See application file for complete search history.

(56) References Cited

U.S. PATENT DOCUMENTS

| 3,635,037 | A | * | 1/1972 | Hubert | 62/3.2 |
| 5,124,639 | A | * | 6/1992 | Carlin et al. | 324/760 |
| 6,181,145 | B1 | * | 1/2001 | Tomita et al. | 324/754 |
| 2006/0243316 | A1 | * | 11/2006 | McCullough | 136/205 |

FOREIGN PATENT DOCUMENTS

| JP | 08-330370 | | 12/1996 |
| JP | 11-174089 | | 7/1999 |
| JP | 2003-215162 | | 7/2003 |
| JP | 2003-346691 | | 12/2003 |
| KR | 10-2001-0103898 | | 11/2001 |
| KR | 2005067758 A | * | 7/2005 |

* cited by examiner

*Primary Examiner*—Vinh P Nguyen
(74) *Attorney, Agent, or Firm*—Mills & Onello LLP

(57) ABSTRACT

Provided are a probe card, a test apparatus having the probe card, and a test method using the test apparatus. The probe card includes a probe substrate having a signal line, a probe needle connected to the signal line and fixed to the probe substrate, and a cooling unit for cooling the temperature of the probe needle. Therefore, the probe needles contacting each chip can be maintained at a certain low temperature without increasing the temperature. As a result, it is possible to prevent deformation of the probe needles and minimize an amount of impurities stuck to the probe needles.

28 Claims, 4 Drawing Sheets

PROBE CARD THAT CONTROLS A TEMPERATURE OF A PROBE NEEDLE, TEST APPARATUS HAVING THE PROBE CARD, AND TEST METHOD USING THE TEST APPARATUS

This application claims the benefit of Korean Patent Application No. 2005-0067376, filed Jul. 25, 2005, the contents of which are hereby incorporated herein by reference in their entirety.

BACKGROUND OF THE INVENTION

1. Field of the Invention

The present invention relates to an apparatus and method used in an electrical die sorting (EDS) process of a semiconductor test process, and more particularly, to a probe card that transmits an electrical signal for testing a chip to a chip pad on a wafer, a test apparatus having the probe card, and a test method using the test apparatus.

2. Description of Related Art

Generally, a semiconductor manufacturing process includes a fabrication process for forming a plurality of chips on a wafer, an EDS process for testing electrical characteristics of each chip formed on the wafer, and an assembly process for individually separating good chips tested by the EDS process and packaging the chips to prevent the chips from mechanical, physical, and chemical impact from the exterior.

The EDS process is a process of determining whether each chip formed on the wafer is good or bad by transmitting a predetermined electrical signal to each chip on the wafer and then checking a signal received in response to the transmitted electrical signal.

However, since each chip formed on the wafer has a very small size, it is very difficult to directly connect a tester for applying a predetermined electrical signal to each chip. Therefore, a probe card is used as an intermediate device, and the probe card having a plurality of probe needles is disposed between the tester for generating the predetermined electrical signal and the wafer at which the chips are formed. The tester generates a predetermined electrical signal for testing the chip to transmit the signal to the probe card, and the probe card transmits the electrical signal to each chip through the probe needles. As a result, whether each chip is good or bad is determined by comparing the transmitted signal and a signal checked from the transmitted signal.

The wafer tested by the EDS process is subjected to a high temperature of about 80~100° C. during the process. This is because it is possible to increase the operational reliability of the wafer by testing the chip at high temperature.

However, in this case, the probe needles contacting the chip on the wafer are also heated to the high temperature, which to causes various problems.

First, the probe needles heated to the high temperature may be deformed, i.e., twisted, bent or the like. In this case, since the probe needles may not be in contact with a terminal of the chip, i.e., a pad of the chip, with which the probe needles should be contacted, a good chip may be mistaken as a bad chip.

Second, the probe needles heated to the high temperature may be more readily stained with impurities in comparison with the probe needles at a low temperature. In this case, the probe needles may also mistake a good chip stained with the impurities as a bad chip. Therefore, after contacting a certain number of chips, the probe needles are sanded by a surface having a predetermined roughness such as sand paper to remove the impurities stuck to an end of the needle. However, since the end of the needle may be more readily stained with the impurities due to the high temperature, the sanding time is increased, thereby significantly reducing the number of chips that can be tested per unit time.

SUMMARY OF THE INVENTION

The present invention, therefore, provides a probe card capable of preventing deformation of a probe needle, a test apparatus having the probe card, and a test method using the test apparatus.

The present invention also provides a probe card capable of minimizing an amount of impurities stuck to a probe needle, a test apparatus having the probe card, and a test method using the test apparatus.

In one aspect of the present invention, a probe card includes: a probe substrate having a signal line; a probe needle connected to the signal line and fixed to the probe substrate, and a thermostat for controlling the temperature of the probe needle.

The thermostat may include a cooling unit for lowering the temperature of the probe needle. In this case, the thermostat may include a temperature detection sensor contacting the probe needle to detect the temperature of the probe needle, and a temperature controller for controlling drive of the cooling unit according to the temperature detected by the temperature detection sensor.

In addition, the cooling unit may include a Peltier module for cooling the probe needle according to a predetermined direct current. The Peltier module may include a first metal member for absorbing heat of the probe needle to cool the probe needle, second metal members respectively connected to one end and the other end of the first metal member to emit the absorbed heat and formed of materials different from the first metal member, and a power source for supplying a predetermined direct current through ends of the second metal members to cool or heat the first and second metal members. In this case, the thermostat may further include a temperature detection sensor contacting the probe needle to detect the temperature of the probe needle, a switch for switching current supply of the power source, and a temperature controller for controlling operation of the switch according to the temperature detected by the temperature detection sensor.

The cooling unit may further include a conductive radiating member contacting the second metal member to radiate heat generated from the second metal member to the exterior. In addition, the cooling unit may further include a heat absorbing member interposed between the first metal member and the probe needle. In this case, the heat absorbing member may be formed of an insulating material having a predetermined thickness.

In another aspect of the present invention, a test apparatus includes: a wafer chuck for mounting a wafer having a plurality of chips; a probe card including a probe needle contacting a pad of the chip to transmit an electrical signal to the chip, a probe substrate having a signal line to be connected to the probe needle and a thermostat for controlling the temperature of the probe needle; and a tester for generating a test signal to test the chip and transmitting the test signal to the probe card.

The thermostat may include a cooling unit for lowering the temperature of the probe needle. In this case, the thermostat may include a temperature detection sensor contacting the probe needle to detect the temperature of the probe needle, and a temperature controller for controlling drive of the cooling unit according to the temperature detected by the temperature detection sensor.

In addition, the cooling unit may include a Peltier module having a first metal member for absorbing heat of the probe needle to cool the probe needle, second metal members respectively connected to one end and the other end of the first metal member to emit the absorbed heat and formed of materials different from the first metal member, and a power source for supplying a predetermined direct current through ends of the second metal members to cool or heat the first and second metal members. In this case, the thermostat may further include a temperature detection sensor contacting the probe needle to detect the temperature of the probe needle, a switch for switching current supply of the power source, and a temperature controller for controlling operation of the switch according to the temperature detected by the temperature detection sensor.

The cooling unit may further include a conductive radiating member contacting the second metal member to radiate heat generated from the second metal member, and a heat absorbing member interposed between the first metal member and the probe needle and formed of an insulating material having a predetermined thickness.

In yet another aspect of the present invention, a test method includes: bringing a probe needle into contact with a pad of a chip formed on a wafer, transmitting a test signal to the chip through the pad, and controlling the temperature of the probe needle.

Controlling the temperature of the probe needle may include lowering the temperature of the probe needle using a cooling unit. In this case, controlling the temperature of the probe needle may further include detecting the temperature of the probe needle through a temperature detection sensor, and controlling drive of the cooling unit according to the temperature detected by the temperature detection sensor. In addition, lowering the temperature of the probe needle may include lowering the temperature of the probe needle using a Peltier module. Controlling the temperature of the probe needle may further include detecting the temperature of the probe needle through the temperature detection sensor, and switching current supply to the Peltier module according to the temperature detected by the temperature detecting sensor.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
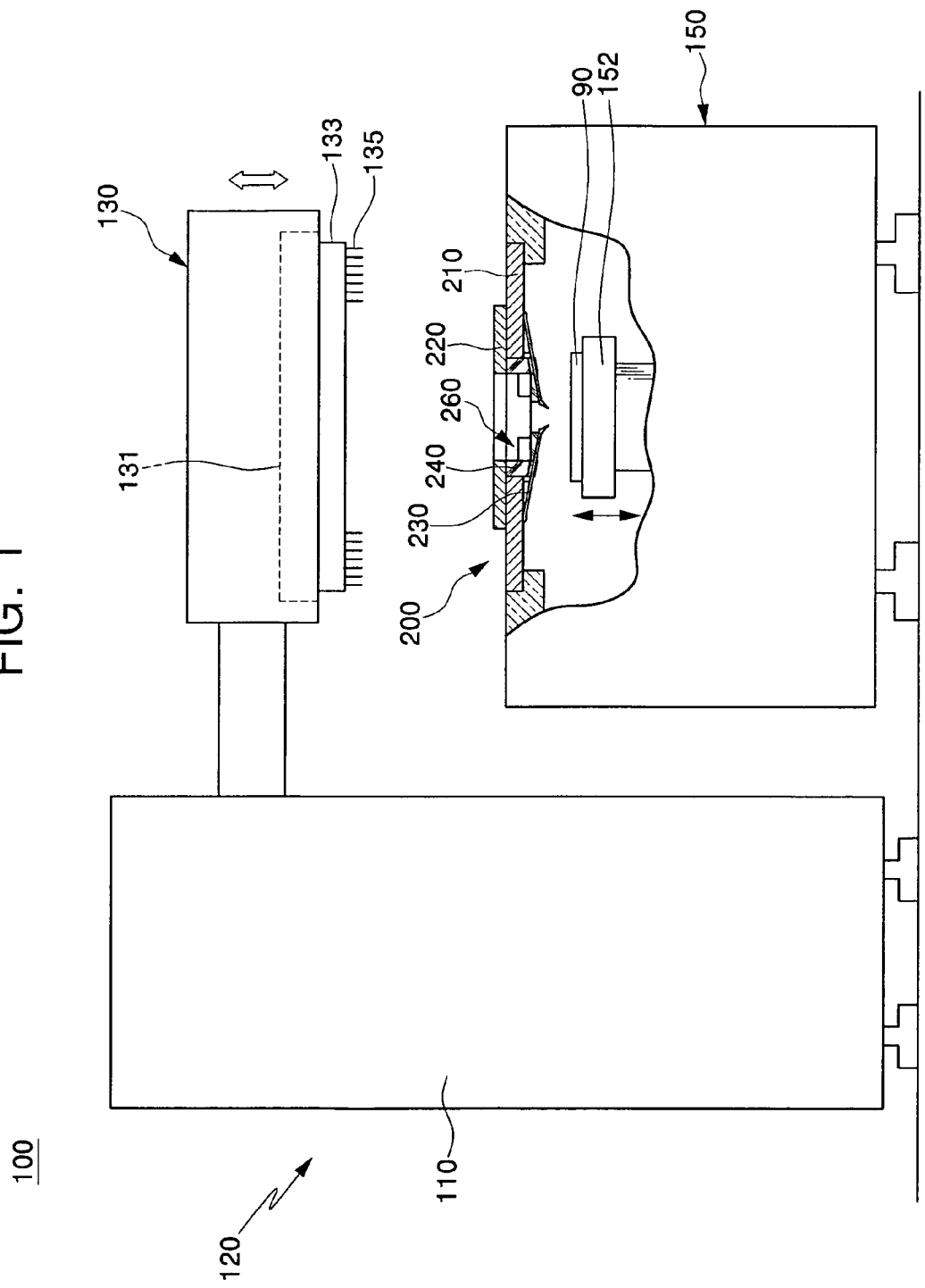
FIG. 1 is a side view of a test apparatus in accordance with an embodiment of the present invention.
Figure 2:
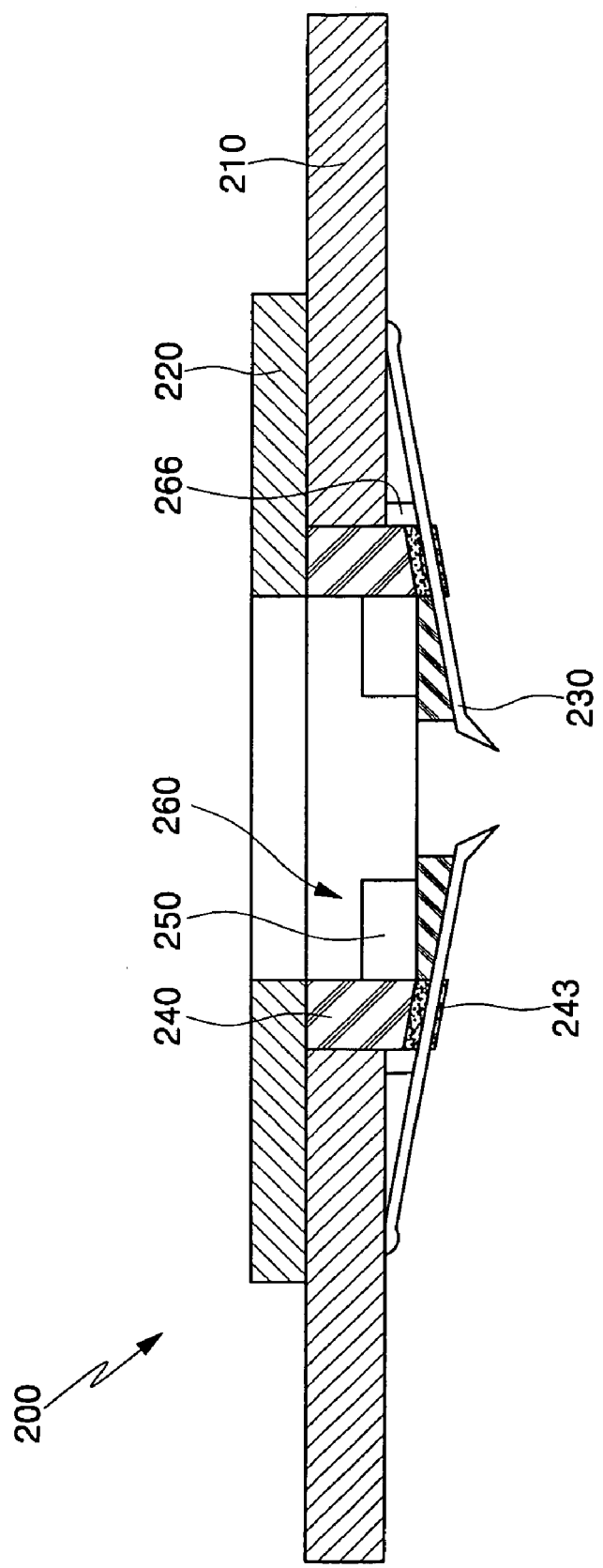
FIG. 2 is a cross-sectional view of one embodiment of a probe card of the test apparatus shown in FIG. 1.
Figure 3:
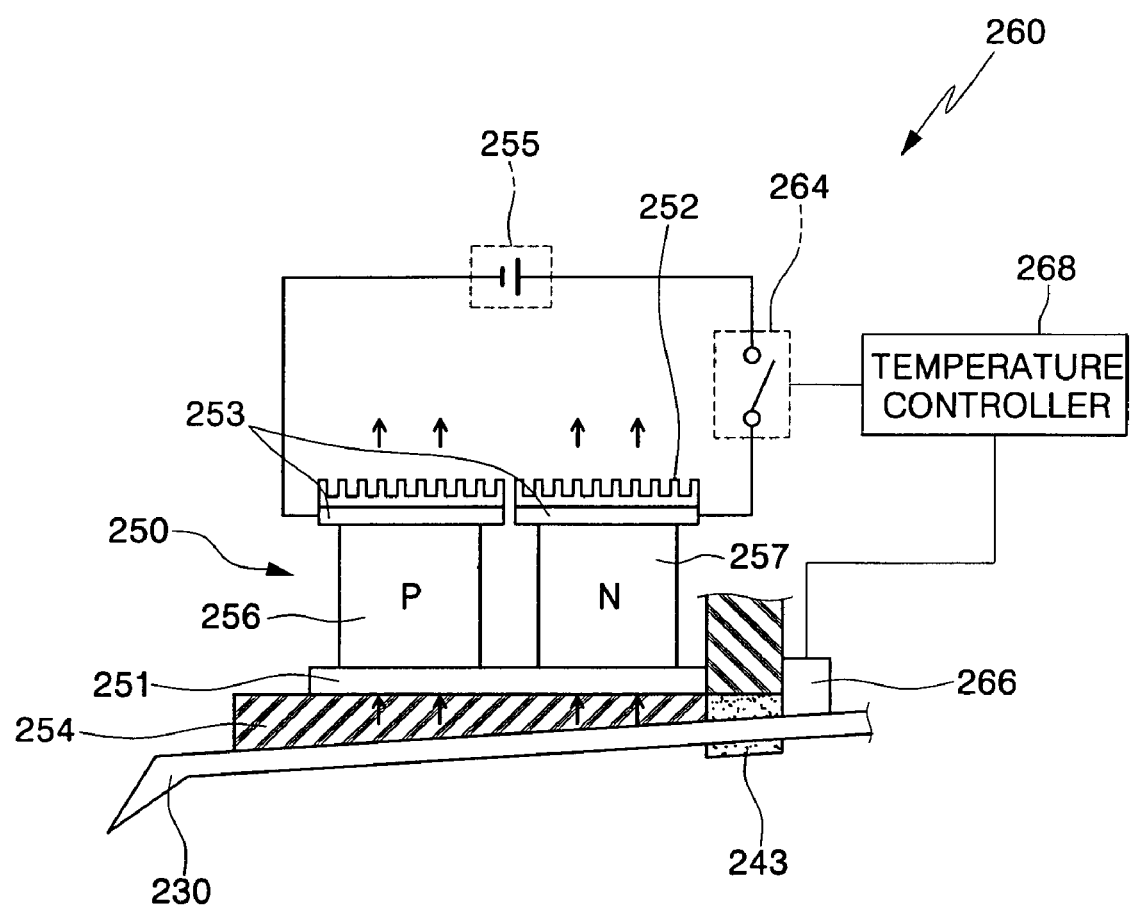
FIG. 3 is a cross-sectional view of embodiments of a cooling unit and a thermostat of a probe card in accordance with the present invention.

FIG. 1 is a side view of a test apparatus in accordance with an embodiment of the present invention, FIG. 2 is a cross-sectional view of a probe card of the test apparatus shown in FIG. 1, and FIG. 3 is a cross-sectional view of a cooling unit and a thermostat of a probe card in accordance with the present invention.

Referring to FIGS. 1 to 3, a test apparatus 100 in accordance with an embodiment of the present invention includes a tester 120 for generating a predetermined electrical signal, i.e., a test signal, to test a chip and transmitting the test signal to the chip, a prober 150 for moving a wafer 90 to allow the tester 120 to perform a test, and a probe card 200 functioning as an intermediate device for transmitting the signal generated from the tester 120 to the chip formed on the wafer 90.

Specifically, the tester 120 includes a test body 110, and a test head 130 raised and lowered from the test body 110 by a predetermined distance.

The test body 110 functions to entirely control the chip test and determine whether the chip is good or bad. For example, the test body 110 functions to generate a test signal for testing the chip and transmit the test signal to the test head 130, and functions to detect a signal checked from the transmitted signal and determine whether each chip is good or bad on the basis of the detected signal.

The test head 130 is raised and lowered from the test body 110, and selectively docked with the probe card 200. Therefore, the test signal transmitted from the test body 110 is transmitted to the probe card 200 via the test head 130. At this time, the test head 130 may include a test board 131 accommodated to the characteristics of the chip to be tested, and a pogo block 133 engaged with a lower part of the test board 131. In this case, the pogo block 133 may include a plurality of pogo pins 135 provided at its lower surface and electrically connected to signal lines formed on the probe card 200. Therefore, a predetermined test signal transmitted from the test body 110 to the test head 130 is transmitted to the probe card 200 by sequentially passing through the test board 131 of the test head 130 and the pogo pins 135 of the pogo block 133.

The prober 150 is disposed under the test head 130 to receive a predetermined test signal from the tester 120. At this time, a card mounting part for mounting the probe card 200 is provided on the prober 150. A wafer chuck 152 for mounting the wafer 90 is installed in the prober 150, i.e., under the card mounting part. The wafer chuck 152 functions to fix the wafer 90 to its upper surface using a vacuum suction method and so on and transfer the wafer 90 along the process line. For example, the wafer chuck 152 can transfer the wafer 90 fixed to the upper surface to a position at which a test is to be performed. In addition, sand paper (not shown) having a predetermined roughness may be provided on one side of the wafer chuck 152. Therefore, when ends of probe needles 230, which are to be described later, are stained with impurities, the probe card 200 can sand the ends of the probe needles 230 to a surface of the sand paper having a predetermined roughness to remove the impurities.

The probe card 200 includes a probe substrate 210 having predetermined signal lines, probe needles 230 connected to the signal lines and fixed to the probe substrate 210, and a thermostat 260 for controlling the temperature of the probe needles 230.

The probe substrate 210 is formed in a shape mountable on the card mounting part, i.e., in a disc shape. In addition, the signal lines function to transmit the signals, which are generated from the test body 110 and transmitted to the test head 130, to the probe needles 230. Therefore, the signal lines may be originated from an upper end of the probe substrate 210 to extend to its lower end through its interior. As a result, the pogo pins 135 of the pogo block 133 are in contact with the upper ends of the signal lines to allow the signal lines to transmit the signals generated from the test body 110 and transmitted to the test head 130.

The probe needles 230 are formed in the shape of a thin needle to be in contact with terminals formed in the chips, i.e., pads at their one ends, and fixed to a lower part of the probe substrate 210 by a predetermined adhesive agent 243 and so on. At this time, the probe needles 230 function to transmit predetermined test signals transmitted through the signal lines to the pads of the chips. The probe needles 230 may be composed of a plurality of probe needles to transmit the predetermined test signals to the plurality of chips at a time. In this case, the probe needles 230 may be symmetrically disposed in both directions or in four directions about a center of the probe substrate 210. In addition, each end of the probe needles 230 provided at the center of the prove substrate 210 may be bent at a predetermined angle to be in contact with the pads of the chips. In addition, the other ends of the probe needles 230 provided at edges of the probe substrate 210 may be connected to lower ends of the signal lines formed on the probe substrate 210 by a welding method or other method.

The probe card 200 may further include a needle fixture 240 and a support plate 220 for fixing the probe needle 230. In this case, the support plate 220 may be formed in the form of a disc having a diameter smaller than that of the probe substrate 210 to be fixed to an upper center of the probe substrate 210, and the needle fixture 240 may be fixed to the support plate 220 and have a lower end extending below the probe substrate 210. Therefore, the probe needle 230 may be fixed to the needle fixture 240 at its one center surface by the predetermined adhesive agent 243.

The thermostat 260 may include a cooling unit 250 for lowering the temperature of the probe needle 230. In one embodiment, the cooling unit 250 may be a Peltier module for cooling the probe needle 230 by a predetermined direct current. Specifically, the Peltier module may include a first metal member 251 contacting the probe needle 230 and absorbing heat of the probe needle 230 to cool the probe needle 230, second metal members 253 respectively connected to one end and the other end of the first metal member 251 to emit the absorbed heat and formed of materials different from the first metal member 251, and a power source 255 for supplying a predetermined direct current through the ends of the second metal members 253 to cool or heat the first and second metal members 251 and 253. Therefore, when a predetermined direct current is supplied from the power source 255, the first metal member 251 and the second metal members 253 absorb and emit heat to cool the probe needle 230, respectively. In this process, at least two different semiconductors, i.e., at least one p-type semiconductor 256 and at least one n-type semiconductor 257 may be installed between the first metal members 251 and the second metal members 253, respectively. In this case, it is possible to increase heat absorbing and emitting efficiencies of the first and second metal members 251 and 253. In addition, the cooling unit 250 may further include a conductive radiating member 252 contacting the second metal member 253 of the Peltier module to emit the heat generated from the second metal member 253 to the exterior, and a heat absorbing member 254 interposed between the first metal member 251 of the Peltier module and the probe needle 230 to absorb the heat of the probe needle 230. At this time, the heat absorbing member 254 may be formed of an insulating material or a conductive layer having a predetermined thickness. However, when the heat absorbing member 254 is formed of a conductive material, the probe needle 230 should be cooled only before or after the test process.

The thermostat 260 may further include a temperature detection sensor 266 contacting a surface of the probe needle 230 to detect the temperature of the probe needles 230, and a temperature controller 268 connected to the temperature detection sensor 266 and controlling the drive of the cooling unit 250 according to the temperature detected by the temperature detection sensor 266. Therefore, when the temperature of the probe needle 230 increases more than a predetermined temperature during the test process, the temperature controller 268 detects the temperature through the temperature detection sensor 266 and then transmits a predetermined signal to the cooling unit 250 to drive the cooling unit 250, thereby cooling the probe needle 230. In addition, when the probe needle 230 is cooled to a temperature lower than the predetermined temperature by driving the cooling unit 250, the temperature controller 268 transmits the predetermined signal to the cooling unit 250 to stop the drive of the cooling unit 250. As a result, it is possible to adjust the temperature of the probe needle 230 using the abovementioned mechanism.

In another embodiment, when the cooling unit 250 is the Peltier module, the thermostat 260 may further include a temperature detection sensor 266 for detecting the temperature of the probe needle 230, a switch 264 for switching the current supply of the power source 255, and a temperature controller 268 for controlling operation of the switch 264 according to the temperature detected by the temperature detection sensor 266. Therefore, when the temperature of the probe needle 230 increases higher than a predetermined temperature, the temperature controller 268 detects the temperature through the temperature detection sensor 266, and then turns on the switch 264 to cool the probe needle 230. Therefore, the power supplied from the power source 255 is supplied to the metal members 251 and 253 of the Peltier module so that the first metal member 251 absorbs the temperature of the probe needle 230 through heat absorbing member 254, and the second metal members 253 emits the absorbed heat to the exterior through the radiating member 252. Then, when the probe needle 230 is cooled to a temperature lower than the predetermined temperature by driving the Peltier module, the temperature controller 268 turns off the switch 264 to block the power supplied to the metal members 251 and 253 of the Peltier module. As a result, it is possible to maintain the temperature of the probe needle 230 for a certain time without lowering the temperature.

Hereinafter, an embodiment of a test method using the test apparatus of the present invention will be described with reference to FIG. 4.

Figure 4:
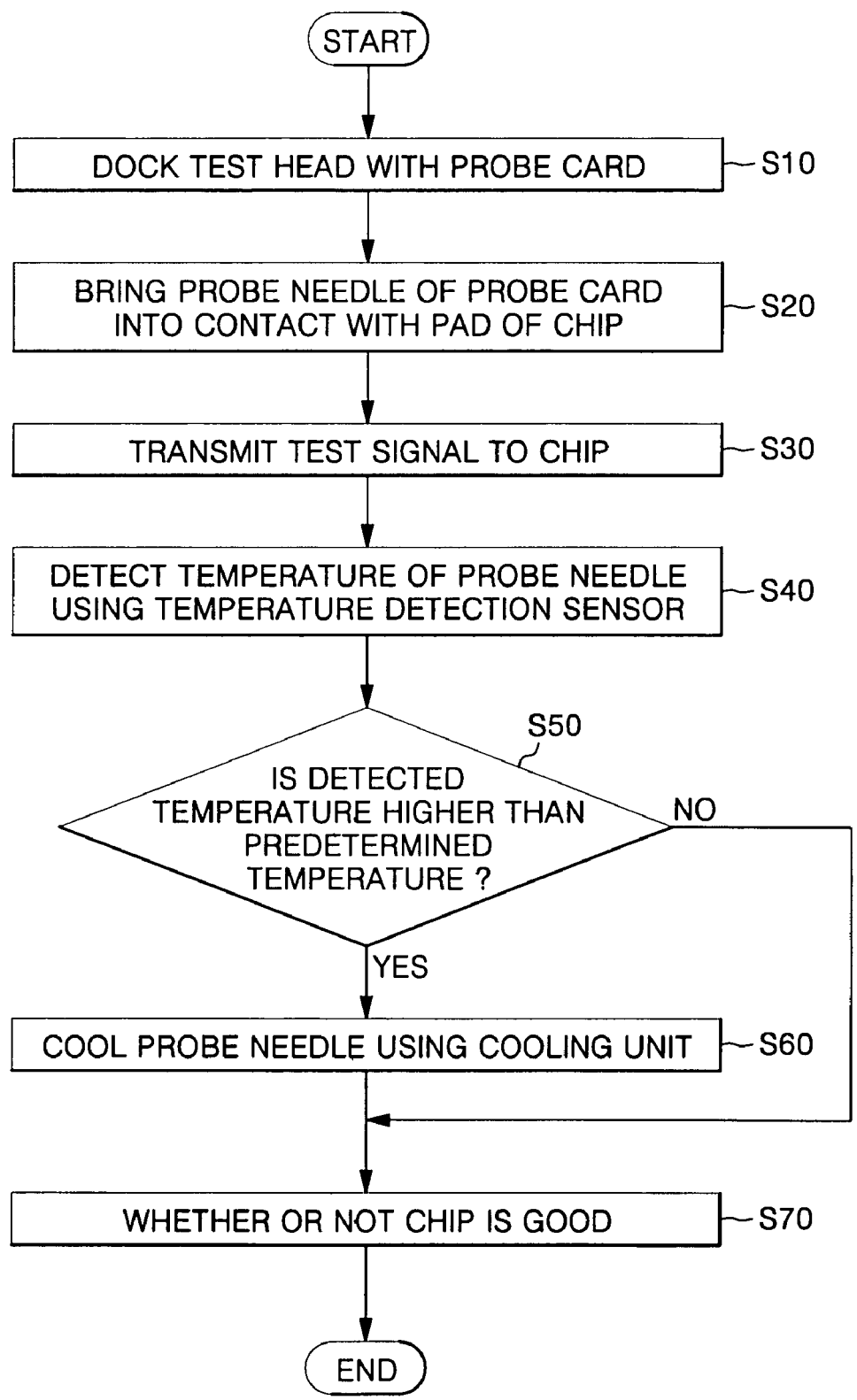
FIG. 4 is a flowchart illustrating an embodiment of a test method in accordance with the present invention.

FIG. 4 is a flowchart illustrating an embodiment of a test method in accordance with the present invention.

When a wafer 90 to be tested is loaded from the exterior using a wafer transfer apparatus (not shown) to be mounted onto a wafer chuck 152 in a prober 150, a test apparatus 100 docks a test head 130 with a probe card 200 mounted on a card mounting part of the prober 150 ( step S10). Therefore, pogo pins 135 of a pogo block 133 installed at a lower part of the test head 130 are connected to signal lines formed on the probe card 200.

The wafer chuck 152 is moved to predetermined coordinates or raised to a predetermined height to make the probe needles 230 contact pads of chips formed on the wafer 90 so that the chips of the wafer 90 mounted on the wafer chuck 152 are tested (step S20).

A tester 120 transmits predetermined electrical signals transmitted through the test head 130, the pogo block 133, the pogo pins 135, the signal lines of the probe substrate 210, and the probe needles 230 connected to the signal lines, i.e., the test signals to the chips through the pads of the chips (step S30). Therefore, the predetermined test signals are transmitted to each chip, and the tester 120 detects signals checked from the transmitted test signals and determines whether the chips are good or bad on the basis of the detected signals (step S70). At this time, the probe needles 230 contacting the chips on the wafer 90 may be heated to a high temperature due to the temperature of the wafer chuck 152 and so on.

For this reason, the controller 268 detects the temperature of the probe needles 230 through the temperature detection sensor 266 (step S40). Therefore, when the detected temperature is lower than a predetermined temperature (step S50), the test is continuously performed, however, when the detected temperature is higher than the predetermined temperature (step S50), the temperature controller 268 transmits a predetermined signal to the cooling unit 250 to drive the cooling unit 250, thereby cooling the heated probe needles 230 down to their original temperature (step S60).

Then, when the probe needles 230 are cooled down to the original temperature (step S60), the temperature controller 268 stops the drive of the cooling unit 250, and the test apparatus 100 continuously performs the test operation, i.e., the determination process of the chips (step S70).

As can be seen from the foregoing, since the present invention provides a cooling unit capable of cooling probe needles, it is possible to maintain the temperature of the probe needles appropriate to perform the test process, i.e., a certain lower temperature, without increasing the temperature during the test process. As a result, it is possible to prevent deformation of the probe needles caused by the high temperature.

In addition, since the probe needles are maintained at a certain low temperature, an amount of impurities stuck to the probe needles can be minimized. Therefore, a sanding time for removing the impurities is remarkably reduced, and the number of test chips per unit time can be dramatically increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A probe card comprising:
    a probe substrate having a signal line;
    a probe needle connected to the signal line and fixed to the probe substrate; and
    a thermostat for controlling the temperature of the probe needle, wherein the thermostat comprises a temperature detection sensor contacting the probe needle to detect the temperature of the probe needle.

2. The probe card according to claim 1, wherein the thermostat comprises a cooling unit for lowering the temperature of the probe needle.

3. The probe card according to claim 2, wherein the thermostat further comprises a temperature controller for controlling drive of the cooling unit according to the temperature detected by the temperature detection sensor.

4. The probe card according to claim 2, wherein the cooling unit comprises a Peltier module for cooling the probe needle according to a predetermined direct current.

5. The probe card according to claim 4, wherein the Peltier module comprises a first metal member for absorbing heat of the probe needle to cool the probe needle, second metal members respectively connected to one end and the other end of the first metal member to emit the absorbed heat and formed of materials different from the first metal member, and a power source for supplying a predetermined direct current through ends of the second metal members to cool or heat the first and second metal members.

6. The probe card according to claim 5, wherein the thermostat further comprises a temperature detection sensor contacting the probe needle to detect the temperature of the probe needle, a switch for switching current supply of the power source, and a temperature controller for controlling operation of the switch according to the temperature detected by the temperature detection sensor.

7. The probe card according to claim 5, wherein the cooling unit further comprises a conductive radiating member contacting the second metal member to radiate heat generated from the second metal member to the exterior.

8. The probe card according to claim 5, wherein the cooling unit further comprises a heat absorbing member interposed between the first metal member and the probe needle.

9. The probe card according to claim 8, wherein the heat absorbing member is formed of an insulating material having a predetermined thickness.

10. A test apparatus comprising:
    a wafer chuck for mounting a wafer having a plurality of chips;
    a probe card having a probe needle contacting a pad of the chip to transmit an electrical signal to the chip, a probe substrate having a signal line to be connected to the probe needle, and a thermostat for controlling the temperature of the probe needle; and
    a tester for generating a test signal to test the chip and transmitting the test signal to the probe card,
    wherein the thermostat comprises a temperature detection sensor contacting the probe needle to detect the temperature of the probe needle.

11. The test apparatus according to claim 10, wherein the thermostat comprises a cooling unit for lowering the temperature of the probe needle.

12. The test apparatus according to claim 11, wherein the thermostat further comprises a temperature controller for controlling drive of the cooling unit according to the temperature detected by the temperature detection sensor.

13. The test apparatus according to claim 11, wherein the cooling unit comprises a Peltier module having a first metal member for absorbing heat of the probe needle to cool the probe needle, second metal members respectively connected to one end and the other end of the first metal member to emit the absorbed heat and formed of materials different from the first metal member, and a power source for supplying a predetermined direct current through ends of the second metal members to cool or heat the first and second metal members.

14. The test apparatus according to claim 13, wherein the thermostat further comprises a temperature detection sensor contacting the probe needle to detect the temperature of the probe needle, a switch for switching current supply of the power source, and a temperature controller for controlling operation of the switch according to the temperature detected by the temperature detection sensor.

15. The test apparatus according to claim 13, wherein the cooling unit further comprises a conductive radiating member contacting the second metal member to radiate heat generated from the second metal member, and a heat absorbing member interposed between the first metal member and the probe needle and formed of an insulating material having a predetermined thickness.

16. A test method, comprising:
    bringing a probe needle into contact with a pad of a chip formed on a wafer;
    transmitting a test signal to the chip through the pad; and controlling the temperature of the probe needle,
wherein controlling the temperature of the probe needle further comprises detecting the temperature of the probe needle through a temperature detection sensor contacting the probe needle.

17. The test method according to claim 16, wherein controlling the temperature of the probe needle comprises lowering the temperature of the probe needle using a cooling unit.

18. The test method according to claim 17, wherein controlling the temperature of the probe needle further comprises controlling drive of the cooling unit according to the temperature detected by the temperature detection sensor.

19. The test method according to claim 17, wherein lowering the temperature of the probe needle comprises lowering the temperature of the probe needle using a Peltier module.

20. The test method according to claim 19, wherein controlling the temperature of the probe needle further comprises detecting the temperature of the probe needle through a temperature detection sensor, and switching current supply to the Peltier module according to the temperature detected by the temperature detecting sensor.

21. A probe card comprising:
a probe substrate having a signal line;
a probe needle connected to the signal line and fixed to the probe substrate; and
a thermostat for controlling the temperature of the probe needle,
wherein the thermostat comprises a cooling unit for lowering the temperature of the probe needle and the cooling unit comprises a Peltier module for cooling the probe needle according to a predetermined direct current,
wherein the Peltier module comprises a first metal member for absorbing heat of the probe needle to cool the probe needle, second metal members respectively connected to one end and the other end of the first metal member to emit the absorbed heat and formed of materials different from the first metal member, and a power source for supplying a predetermined direct current through ends of the second metal members to cool or heat the first and second metal members.

22. The probe card according to claim 21, wherein the thermostat further comprises a temperature detection sensor contacting the probe needle to detect the temperature of the probe needle, a switch for switching current supply of the power source, and a temperature controller for controlling operation of the switch according to the temperature detected by the temperature detection sensor.

23. The probe card according to claim 21, wherein the cooling unit further comprises a conductive radiating member contacting the second metal member to radiate heat generated from the second metal member to the exterior.

24. The probe card according to claim 21, wherein the cooling unit further comprises a heat absorbing member interposed between the first metal member and the probe needle.

25. The probe card according to claim 24, wherein the heat absorbing member is formed of an insulating material having a predetermined thickness.

26. A test apparatus comprising:
a wafer chuck for mounting a wafer having a plurality of chips;
a probe card having a probe needle contacting a pad of the chip to transmit an electrical signal to the chip, a probe substrate having a signal line to be connected to the probe needle, and a thermostat for controlling the temperature of the probe needle; and
a tester for generating a test signal to test the chip and transmitting the test signal to the probe card,
wherein the thermostat comprises a cooling unit for lowering the temperature of the probe needle, and
wherein the cooling unit comprises a Peltier module having a first metal member for absorbing heat of the probe needle to cool the probe needle, second metal members respectively connected to one end and the other end of the first metal member to emit the absorbed heat and formed of materials different from the first metal member, and a power source for supplying a predetermined direct current through ends of the second metal members to cool or heat the first and second metal members.

27. The test apparatus according to claim 26, wherein the thermostat further comprises a temperature detection sensor contacting the probe needle to detect the temperature of the probe needle, a switch for switching current supply of the power source, and a temperature controller for controlling operation of the switch according to the temperature detected by the temperature detection sensor.

28. The test apparatus according to claim 26, wherein the cooling unit further comprises a conductive radiating member contacting the second metal member to radiate heat generated from the second metal member, and a heat absorbing member interposed between the first metal member and the probe needle and formed of an insulating material having a predetermined thickness.

* * * * *